United States Patent
Oh et al.

(10) Patent No.: US 10,485,147 B2
(45) Date of Patent: Nov. 19, 2019

(54) DISPLAY DEVICE

(71) Applicant: LG ELECTRONICS INC., Seoul (KR)

(72) Inventors: Honglyeol Oh, Seoul (KR); Sangjoon Oh, Seoul (KR); Byoungwook Han, Seoul (KR); Joongnyon Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/906,395

(22) Filed: Feb. 27, 2018

(65) Prior Publication Data

US 2018/0310439 A1    Oct. 25, 2018

Related U.S. Application Data

(60) Provisional application No. 62/488,842, filed on Apr. 23, 2017, provisional application No. 62/528,542, filed on Jul. 5, 2017.

(30) Foreign Application Priority Data

Nov. 24, 2017 (KR) .................. 10-2017-0158952

(51) Int. Cl.
*H05K 7/20* (2006.01)
*G02F 1/1335* (2006.01)
*G02F 1/1333* (2006.01)

(52) U.S. Cl.
CPC ... *H05K 7/20972* (2013.01); *G02F 1/133308* (2013.01); *G02F 1/133504* (2013.01);
(Continued)

(58) Field of Classification Search
CPC .......... H05K 7/20972; H05K 7/20136; H05K 7/20336; H05K 7/2099; G02F 1/133308;
(Continued)

(56) References Cited

U.S. PATENT DOCUMENTS 5,869,919 A  *  2/1999  Sato ..................... H01J 29/006
                                                            313/17
5,991,153 A  * 11/1999  Heady .................... H05K 7/202
                                                            165/185
(Continued)

FOREIGN PATENT DOCUMENTS

EP    1951020 A1    7/2008
EP    3040766 A1    7/2016
(Continued)

*Primary Examiner* — Anatoly Vortman
(74) *Attorney, Agent, or Firm* — Birch, Stewart, Kolasch & Birch, LLP

(57) ABSTRACT

A display device is provided to achieve air circulation through an inner structure or an outer structure of the display device for efficient heat dissipation. The display device includes a housing, a display module mounted in the housing, a closed-loop air circulation system, and an open-loop air circulation system. The closed-loop air circulation system includes a first channel defined between a front surface of the display module and a front surface of the housing so as to extend along the front surface of the display module, and a second channel defined between one side surface of the display module and one side surface of the housing that is opposite the one side surface of the display module. The first channel is configured to receive air from a first end of the second channel and to discharge the air to a second end of the second channel.

11 Claims, 13 Drawing Sheets

(52) U.S. Cl.
CPC ....... *H05K 7/2099* (2013.01); *H05K 7/20136* (2013.01); *H05K 7/20336* (2013.01); *H05K 7/20963* (2013.01); *H05K 7/20981* (2013.01); *G02F 2001/133314* (2013.01); *G02F 2001/133331* (2013.01)

(58) Field of Classification Search
CPC ... G02F 1/133504; G02F 2001/133314; G02F 2001/133331
USPC ......... 361/679.21, 679.22, 679.47, 690, 704, 361/715; 165/80.3, 104.33, 104.34, 185; 313/46; 345/60, 905; 348/748; 349/161
See application file for complete search history.

(56) References Cited

U.S. PATENT DOCUMENTS

| | | | | |
|---|---|---|---|---|
| 6,067,133 | A * | 5/2000 | Niibori | G02F 1/133308 349/150 |
| 6,198,222 | B1 * | 3/2001 | Chang | H05K 7/20972 313/46 |
| 6,493,440 | B2 * | 12/2002 | Gromatzky | G02F 1/133385 379/161 |
| 6,504,713 | B1 * | 1/2003 | Pandolfi | G02F 1/13338 345/87 |
| 6,753,998 | B2 * | 6/2004 | Takeuchi | G02B 6/0068 345/108 |
| 7,164,586 | B2 * | 1/2007 | Lin | H05K 7/20972 348/794 |
| 7,352,582 | B2 * | 4/2008 | Yokoyama | H01L 51/529 361/679.48 |
| 7,593,226 | B2 * | 9/2009 | Yamanaka | H05K 7/20972 345/905 |
| 7,667,964 | B2 * | 2/2010 | Kang | G02F 1/133308 313/582 |
| 8,144,468 | B2 * | 3/2012 | Nakamichi | G02F 1/133308 361/694 |
| 8,248,784 | B2 * | 8/2012 | Nakamichi | H05K 7/20972 361/679.46 |
| 8,284,328 | B2 * | 10/2012 | Shinki | H04N 5/645 348/739 |
| 8,320,119 | B2 * | 11/2012 | Isoshima | H05K 7/20972 165/104.34 |
| 8,471,997 | B2 * | 6/2013 | Yang | G02F 1/133385 349/161 |
| 8,649,176 | B2 * | 2/2014 | Okada | G02F 1/133382 361/679.5 |
| 9,456,525 | B2 * | 9/2016 | Yoon | H05K 7/20145 |
| 2003/0043091 | A1 * | 3/2003 | Takeuchi | G02B 26/02 345/84 |
| 2005/0286228 | A1 * | 12/2005 | Kim | H05K 7/20963 361/704 |
| 2006/0082271 | A1 * | 4/2006 | Lee | F21V 29/02 313/35 |
| 2007/0018577 | A1 * | 1/2007 | Hwang | H05K 5/0247 313/582 |
| 2007/0076431 | A1 * | 4/2007 | Atarashi | G02B 6/0085 362/613 |
| 2007/0127215 | A1 * | 6/2007 | Jeong | H05K 7/20963 361/710 |
| 2007/0188675 | A1 * | 8/2007 | Tsubokura | G02F 1/133308 349/58 |
| 2007/0247053 | A1 * | 10/2007 | Yoo | H01J 17/18 313/489 |
| 2008/0148609 | A1 * | 6/2008 | Ogorevc | G09F 27/00 40/463 |
| 2009/0147170 | A1 * | 6/2009 | Oh | G02F 1/133308 349/58 |
| 2010/0007258 | A1 * | 1/2010 | Iwata | H01J 11/10 313/12 |
| 2010/0182562 | A1 * | 7/2010 | Yoshida | G02F 1/133385 349/161 |
| 2011/0013114 | A1 | 1/2011 | Dunn et al. | |
| 2011/0051071 | A1 * | 3/2011 | Nakamichi | G06F 1/1601 349/161 |
| 2015/0009627 | A1 | 1/2015 | Dunn et al. | |
| 2015/0195959 | A1 | 7/2015 | Hubbard | |
| 2016/0198589 | A1 | 7/2016 | Kang et al. | |
| 2017/0059938 | A1 | 3/2017 | Brown et al. | |

FOREIGN PATENT DOCUMENTS

| | | |
|---|---|---|
| JP | 9-307257 A | 11/1997 |
| JP | 2013-537721 A | 10/2013 |
| KR | 10-2013-0117251 A | 10/2013 |
| KR | 10-2015-0139625 A | 12/2015 |
| WO | WO 2010/080624 A2 | 7/2010 |

* cited by examiner

DISPLAY DEVICE

This application claims priorities to U.S. Provisional Application Nos. 62/488,842, filed on Apr. 23, 2017, and 62/528,542, filed on Jul. 5, 2017 and Korean Patent Application No. 10-2017-0158952, filed on Nov. 24, 2017 in Republic of Korea, the entire contents of all these applications are hereby incorporated by reference in their entirety.

BACKGROUND OF THE INVENTION

Field of the Invention

The present invention relates to a display device having an efficient heat dissipation structure.

Discussion of the Related Art

A display device is a mechanical unit having a display module mounted therein.

Some types of display devices having large-sized display modules mounted therein are generally installed outdoors, where there is a large amount of foreign matter, such as dust, and a great temperature difference between the display devices and the surroundings.

Under such environmental conditions, the luminance of a display device must be high for sufficient outdoor visibility. In addition, since the display device is exposed to high outdoor temperatures, a structure for efficiently dissipating heat generated from the display device is necessary.

Heat is dissipated from the display device in various manners. Heat dissipation may be classified into water-cooling type heat dissipation and air-cooling type heat dissipation depending on how heat transfer is performed during heat dissipation. In the air-cooling type heat dissipation, the heat dissipation area is maximized using heat dissipation fins, thereby improving heat dissipation efficiency. In the water-cooling type heat dissipation, a heat transfer material is guided using a heat pipe in a hermetically sealed state, thereby improving heat dissipation efficiency.

Only one type of heat dissipation may be used, or two or more types of heat dissipation may be compositely used as needed.

The air-cooling type heat dissipation may be classified into direct-cooling type heat dissipation, in which external air is directly introduced into the display device and in which dust and other foreign matter are filtered from the air using a filter, and indirect-cooling type heat dissipation, in which only heat exchange is performed between external air and air in the display device using a heat exchanger without contact therebetween.

In a display device that is exposed to the outdoors, in which there is a large amount of foreign matter, such as dust, indirect-cooling type heat dissipation may be advantageous. However, indirect-cooling type heat dissipation has low heat dissipation efficiency, since heat exchange is not directly performed between the interior of the display device, from which heat is generated, and external air.

In particular, high-temperature heat is generated from several points of the display device, such as a front panel of the display module, a backlight unit provided at the rear of the display module, and other electronic parts of the display device. If the display device has a single air circulation structure, therefore, internal air that has not undergone heat exchange passes through other heat-generating regions of the display device, whereby sufficient heat exchange may not be achieved.

Consequently, it is necessary to provide a method or a structure for air circulation through an inner structure or an outer structure of the display device for efficient heat dissipation.

SUMMARY OF THE INVENTION

Accordingly, the present invention is directed to a display device that substantially obviates one or more problems due to limitations and disadvantages of the related art.

An object of the present invention is to provide a display device having an efficient heat dissipation structure.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a display device includes a housing, a display module mounted in the housing, a closed-loop air circulation system, and an open-loop air circulation system, wherein the closed-loop air circulation system includes a first channel defined between a front surface of the display module and a front surface of the housing so as to extend along the front surface of the display module, and a second channel defined between one side surface of the display module and one side surface of the housing that is opposite the one side surface of the display module so as to extend along the one side surface of the display module in a longitudinal direction thereof, the first channel being configured to receive air from a first end of the second channel and to discharge the air to a second end of the second channel, and wherein the open-loop air circulation system includes a third channel isolated from the first channel and the second channel, an inlet port for receiving air from the outside through the third channel, and an outlet port for discharging the air to the outside through the third channel.

The housing may include a window for covering at least a portion of the front surface of the display module, and the first channel may be defined between the window and the front surface of the display module.

The display device may further include at least one fan provided at the upper part or the lower part of the display module such that the first channel receives air and discharges the received air to the second channel.

The closed-loop air circulation system may be a first closed-loop air circulation system, and the display device may further include a second closed-loop air circulation system provided at the rear of the first closed-loop air circulation system.

The display device may further include a diaphragm bracket for partitioning the first closed-loop air circulation system and the second closed-loop air circulation system from each other.

The display device may further include a heat exchanger for transferring heat from the closed-loop air circulation system to the open-loop air circulation system.

The display device may further include a front guide bracket for guiding air such that the air is introduced into the second channel from the first channel and such that the air from the second channel is introduced into the heat exchanger.

The heat exchanger may include an auxiliary guide bracket for guiding the air introduced from the second channel so as to discharge the same to the first channel.

The heat exchanger may be any one of a heat pipe type heat exchanger, a water-cooling type heat exchanger, a thermoelectric module type heat exchanger, and a loop heat pipe type heat exchanger.

The closed-loop air circulation system may be hermetically isolated from the open-loop air circulation system.

The display module may include a rear surface, which is opposite the front surface, an upper surface, a lower surface, which defines the inside of the upper surface, a first side surface, and a second side surface, which is opposite the first side surface, and the second channel may be provided at the first side surface and the second side surface of the display module so as to extend along the side surfaces of the display module.

The further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings, which are given by way of illustration only, and thus are not limitative of the present invention, and wherein.

DETAILED DESCRIPTION OF THE INVENTION

Description will now be given in detail according to exemplary embodiments disclosed herein, with reference to the accompanying drawings. For the sake of brevity of description made with reference to the drawings, the same or equivalent components may be provided with the same reference numbers, and description thereof will not be repeated. In general, a suffix such as "module" and "unit" may be used to refer to elements or components. The use of such a suffix herein is merely intended to facilitate the description of the specification, and the suffix itself is not intended to indicate any special meaning or function. In the present invention, that which is well-known to one of ordinary skill in the relevant art has generally been omitted for the sake of brevity. The accompanying drawings are used to help easily understand various technical features, and it should be understood that the embodiments presented herein are not limited by the accompanying drawings. As such, the present invention should be construed to extend to any alterations, equivalents and substitutes in addition to those which are particularly set out in the accompanying drawings.

A display device described in this specification is a common designation for all devices including an output unit for outputting images. Representative examples of the display device include a digital TV, an analog TV, a desktop computer, and a digital signage.

In addition, the display device may further include middle- or large-sized output devices, such as signage installed in an outdoor box.

For example, an outdoor signboard may be included.

In particular, a display device according to the present invention has been developed based on signage installed in an outdoor box described above.

Figure 1A:
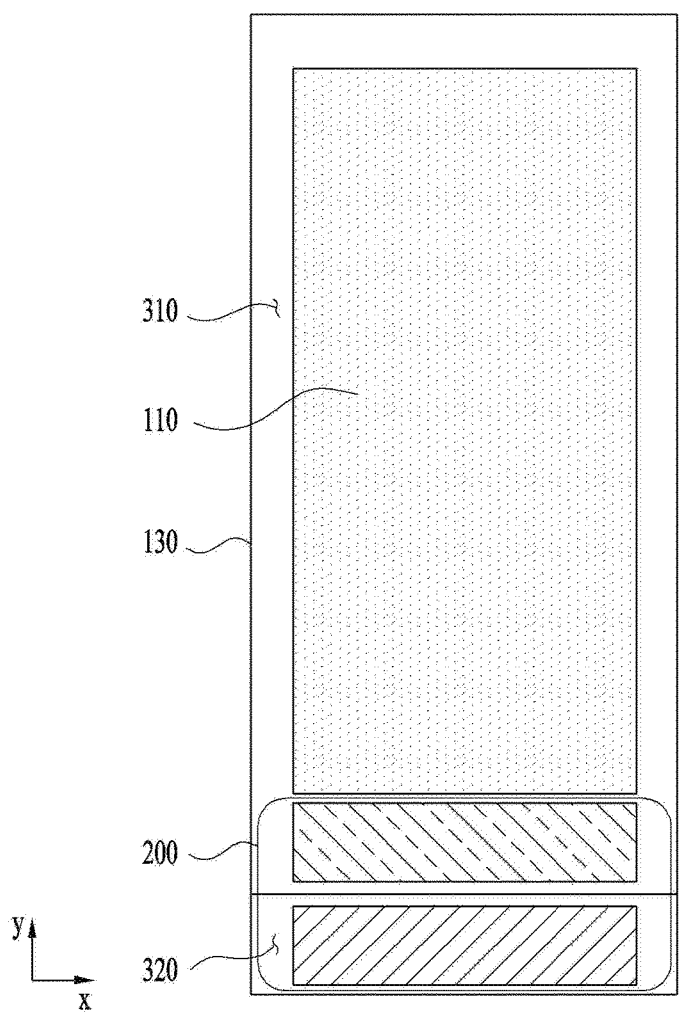
FIG. 1(a) is a conceptual view of a display device according to the present invention when viewed from the front thereof.
Figure 1B:
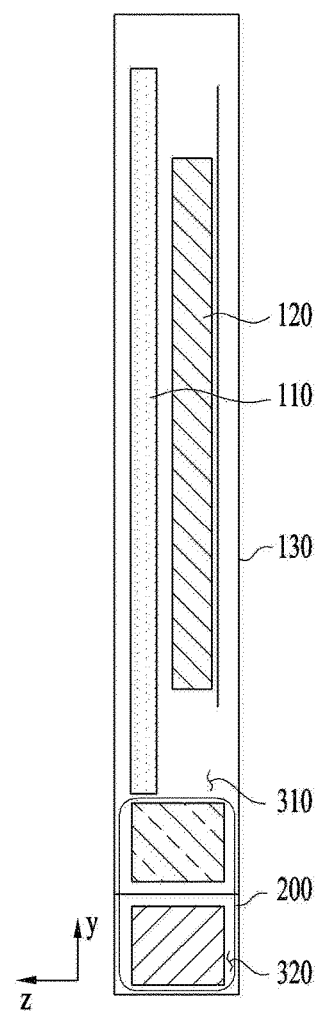
FIG. 1(b) is a side sectional conceptual view of the display device according to the present invention.

FIG. 1(a) is a conceptual view of a display device 100 according to the present invention when viewed from the front thereof, and FIG. 1(b) is a side sectional conceptual view of the display device 100 according to the present invention.

The display device 100 may mainly include a display module 110, a driving unit 120 for driving the display module 110, and a housing 130 for receiving the display module 110 and the driving unit 120.

For the convenience of description, a z-axis direction, in which an image is output from the display device 100, is defined as a forward direction, and a direction opposite the z-axis direction is defined as a rearward direction.

The display module 110 may be provided at the front of the display device 100, and the driving unit 120 may be provided at the rear of the display module 110 in a stacked manner. In the display device 100, therefore, the forward direction or the rearward direction is also defined as a thickness direction.

The type of the display module 110 is not particularly restricted. For example, the display module may be a liquid crystal display (LCD) type display module, an organic light-emitting diode (OLED) type display module, or a micro-LED type display module. In the present invention, the display module will be described as an LCD type display module. However, other types of display modules may be used where possible.

The display module 110 may be configured such that an LCD panel, which is located at the front of the display device 100, a diffuser, and a backlight unit panel are sequentially stacked in the rearward direction.

The driving unit 120 may include electronic components electrically connected to a drive-IC of the display module 110. For example, the driving unit 120 may include a system on chip (SOC) for transmitting a signal for controlling main electronic components of the display device 100 or a battery for supplying electric power to the display module 110. The driving unit 120 may include a printed circuit board (PCB), and the components of the driving unit 120 may be mounted on the PCB.

The housing 130 may form the external appearance of the display device 100, and may receive and support the components of the display module 110 and the driving unit 120.

The housing 130 defines a closed space 310, which is isolated from the space outside the display device 100. The display device 100 may further include a sealing member, such as a gasket, in order to isolate the closed space 310 from the outside space.

The housing 130 may include an open space 320, which is isolated from the closed space 310. The open space 320 may be a space through which air flows between the inside of the display device 100 and the outside of the display device 100.

A heat exchanger 200 performs heat exchange such that heat generated in the display device 100 is dissipated outside. For example, the heat exchanger 200 may be a heat pipe type heat exchanger, a thermoelectric module type heat exchanger, a water-cooling type heat exchanger, or a loop heat pipe (LHP) type heat exchanger.

The heat exchanger 200 may be provided at the side of the display device 100 based on the display module 110 or the driving unit 120.

Conventionally, the heat exchanger 200 is stacked on the display device in the thickness direction thereof. In order to minimize an increase in the total thickness of the display device 100 due to the provision of the heat exchanger 200, however, the heat exchanger 200 may be provided at the side of the display device 100.

The heat exchanger 200 may be provided at the side of the housing 130.

A portion of the closed space 310 and at least a portion of the open space 320 may be included in the heat exchanger 200. The heat exchanger 200 is located at the boundary between the closed space 310 and the open space 320 to transmit heat from the closed space 310 to the open space 320.

The heat exchanger 200 may be provided at the upper side or the lower side of the housing 130. In the case in which the heat exchanger 200 is provided at the upper side of the housing 130, heat dissipation efficiency may be maximized using the nature of air in which hot air goes up and cold air goes down due to the difference in density. On the other hand, in the case in which the heat exchanger 200 is provided at the lower side of the housing 130, air that is introduced into or discharged from the heat exchanger 200 flows near the floor, whereby it is possible to minimize discomfort of people due to air directed to their faces.

In embodiments of the present invention, at least one heat exchanger 200 is provided at the lower side of the display device 100. Alternatively, the heat exchanger 200 may be provided on other sides of the display device 100.

Figure 2:
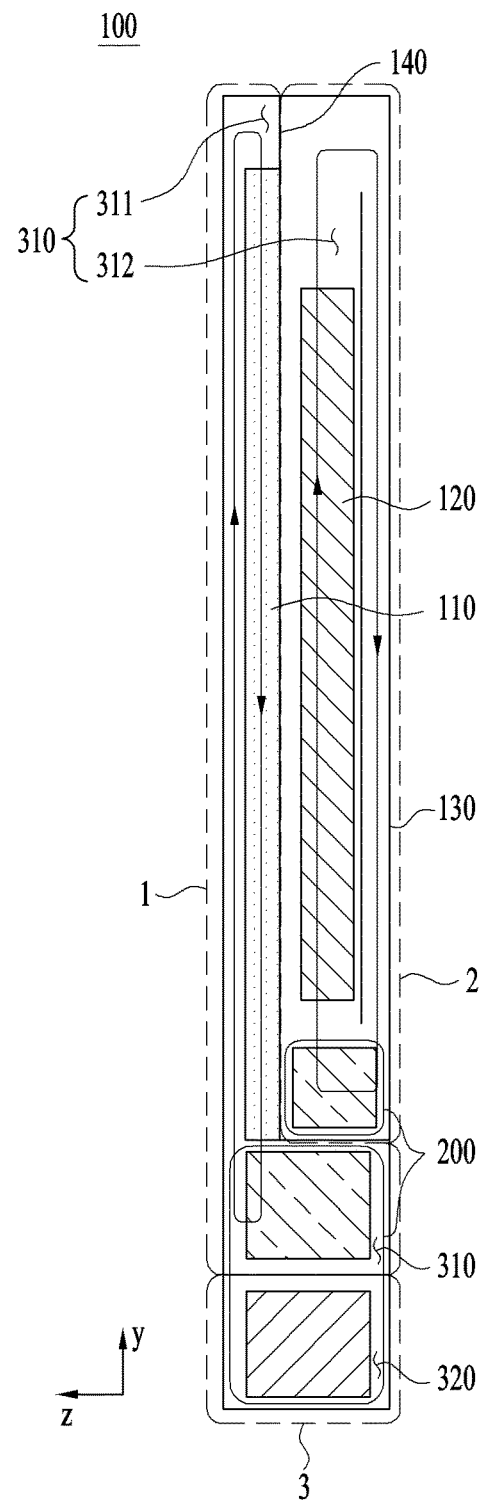
FIG. 2 is a side sectional conceptual view of the display device according to the present invention.

FIG. 2 is a side sectional conceptual view of the display device 100 according to the present invention.

In this embodiment, the closed space 310 may be partitioned into a plurality of spaces based on the state of the display device 100 according to the embodiment shown in FIGS. 1(a) and 1(b).

For example, a diaphragm bracket 140 may partition the closed space 310 of FIG. 1 into a first closed space 311, in which the display module 110 is provided, and a second closed space 312, in which the driving unit 120 is provided.

The diaphragm bracket 140 may not be a single structure, but may comprehensively indicate a structure that partitions the first closed space 311 and the second closed space 312 from each other. The diaphragm bracket 140 may be a single plate-shaped member that vertically extends the closed space 310. Alternatively, the diaphragm bracket 140 may include several members that are coupled to each other.

As one example of the latter case, the diaphragm bracket 140 may be coupled to corners of the rear surface of the display module 110 while extending along the circumference of the side of the housing 130 so as to partition the first closed space 311 and the second closed space 312 from each other.

Heat from the first closed space 311 and the second closed space 312, partitioned from each other by the diaphragm bracket 140, may be transferred to the open space 210 through the heat exchangers 200.

The heat exchanger 200 in the first closed space 311 and the heat exchanger 200 in the second closed space 312 may share the open close 320 for heat dissipation.

A system for circulating air in the first closed space 311 is defined as a front closed-loop air circulation system 1, a system for circulating air in the second closed space 312 is defined as a rear closed-loop air circulation system 2, and a system for circulating air in the open space 320 is defined as an open-loop air circulation system 3.

The front closed-loop air circulation system 1 exchanges heat with the open-loop air circulation system 3 in order to dissipate heat, and the rear closed-loop air circulation system 2 also exchanges heat with the open-loop air circulation system 3 in order to dissipate heat. The front closed-loop air circulation system 1 mainly serves to circulate and dissipate heat generated from the display module 110, and the rear closed-loop air circulation system 2 mainly serves to circulate and dissipate heat generated from the driving unit 120.

Each of the closed-loop air circulation systems 1 and 2 may include a fan for circulating heat so as not to stagnate such that each of the closed-loop air circulation systems 1 and 2 exchanges heat with the open-loop air circulation system 3. Heat may be exchanged through the heat exchangers 200, a detailed description of which will follow.

Figure 3:
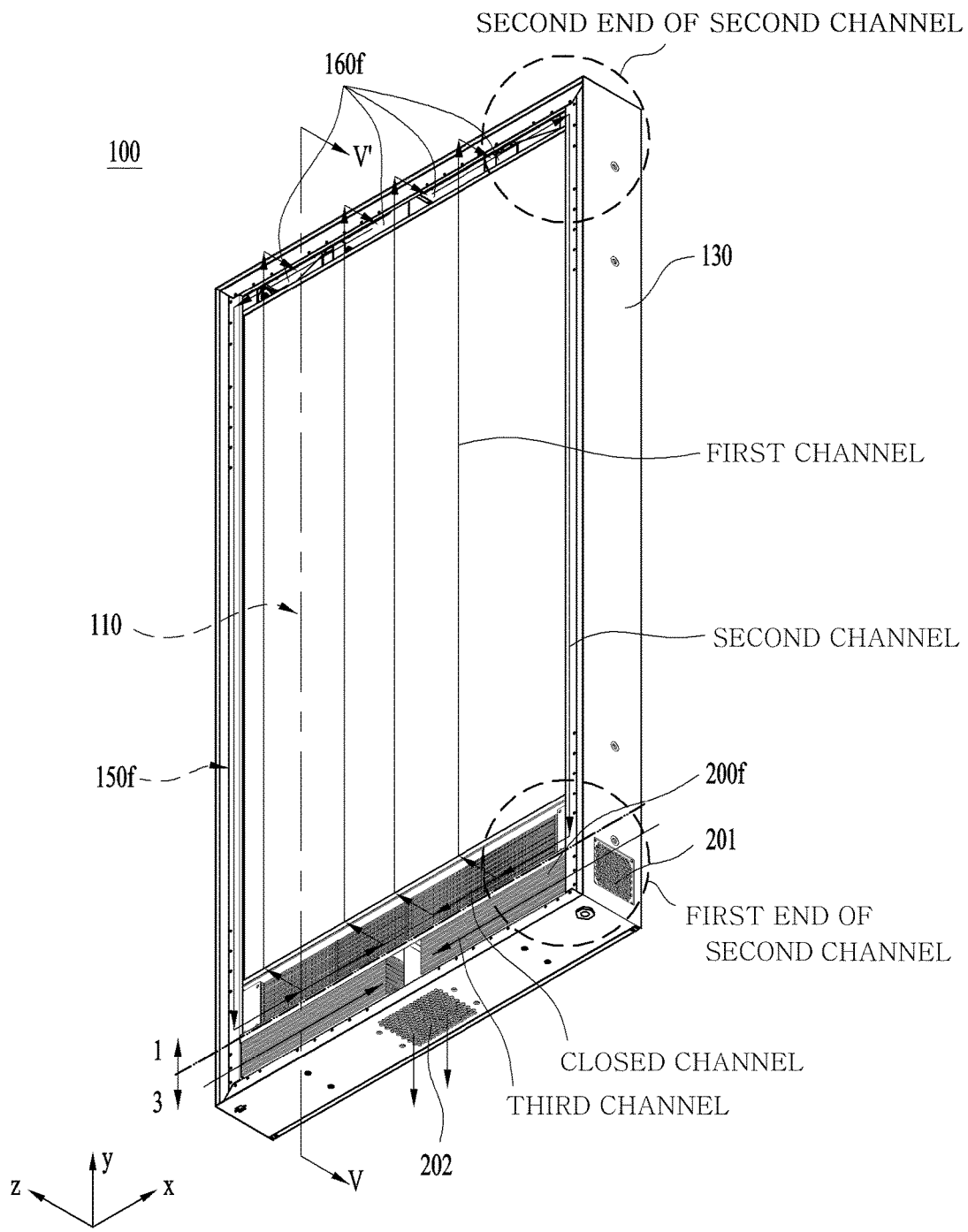
FIG. 3 is a partial perspective view of the display device according to the present invention.
Figure 4:
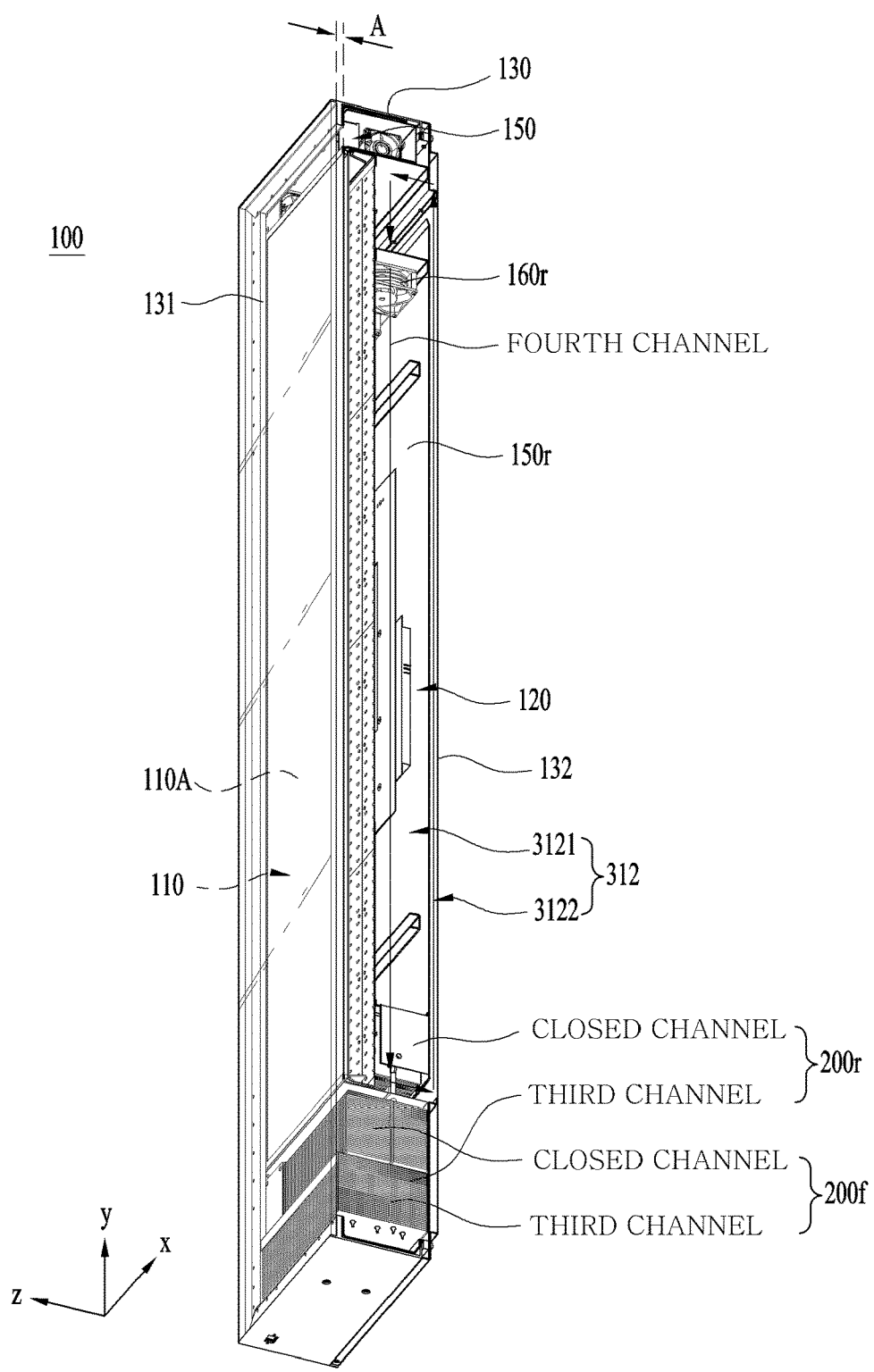
FIG. 4 is a sectional perspective view taken along line V-V' of FIG. 3.
Figure 5:
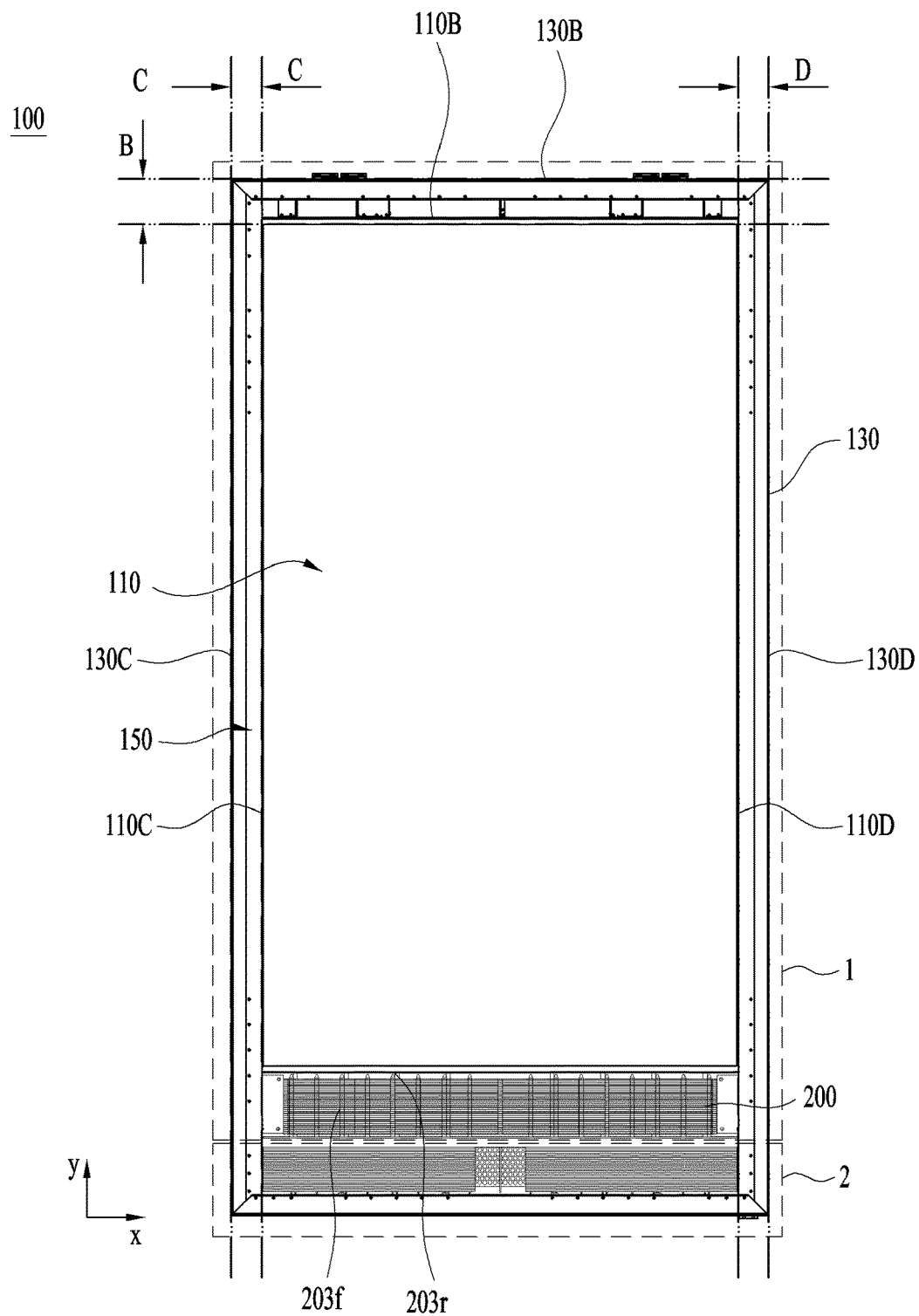
FIG. 5 is a partial front view of the display device according to the present invention.

FIG. 3 is a partial perspective view of the display device 100 according to the present invention. FIG. 4 is a sectional perspective view taken along line V-V' of FIG. 3. FIG. 5 is a partial front view of the display device 100 according to the present invention. For the convenience of description, reference may be made to FIGS. 3 to 5.

In this embodiment, the heat exchangers 200 are provided at the lower end of the display device 100. However, the characteristics that will be described below may apply even when the heat exchangers 200 are provided at other positions of the display device 100 as long as this is not problematic.

The front of the display module 110 and the upper end and the left and right parts of the side of the display module 110 may be spaced apart from the inner side of the housing 130 by a predetermined distance. A window 131, through which an output image is visible, may be provided in at least a portion of the front of the housing 130.

A space between the front of the display module 110 and the front of the housing 130, particularly the window 131, is defined as a front space A, the upper end of the side of the display module 110 is defined as an upper space B, and the left and right parts of the side of the display module 110 are defined as left and right spaces C and D.

The front closed-loop air circulation system 1 may mainly include a first channel and a second channel. A channel defined in the front space A is defined as a first channel, and a channel defined in the left and right spaces C and D is defined as a second channel.

The first channel receives air from a first end of the second channel. The first channel discharges the received air to a second end of the second channel. The first end of the second channel may be one end of the second channel that is adjacent to a front heat exchanger 200f in the longitudinal direction thereof, and the second end of the second channel may be the other end of the second channel that is spaced apart from the front heat exchanger 200f in the longitudinal direction thereof.

A front guide bracket 150f defines a channel in the front closed-loop air circulation system 1 with the display module 110, the housing 130, and the front heat exchanger 200f.

The front heat exchanger 200f may be provided between the first end of the second channel and the first channel. From the first end of the second channel, air passes through the front heat exchanger 200f, by which heat is dissipated, and is introduced into the first channel.

The front heat exchanger 200f is provided at the boundary between the front closed-loop air circulation system 1 and the open-loop air circulation system 3. A portion of the front heat exchanger 200f is included in the front closed-loop air circulation system 1, and the remainder of the front heat exchanger 200f is included in the open-loop air circulation system 3. The former case is defined as a closed channel, and the latter case is defined as a third channel. Heat from the closed channel is transferred to the third channel.

The closed channel interconnects the first end of the second channel and the first channel.

Depending on the type of the front heat exchanger 200f, the structure and arrangement of the closed channel and the third channel may be changed. In the case in which the front heat exchanger 200f is a heat pipe type heat exchanger, the closed channel may be provided at the upper end of the third channel and may be partitioned from the third channel.

The front closed-loop air circulation system 1 may include a front inner fan 160f. The front inner fan 160f serves to circulate air in the front closed-loop air circulation system 1 such that air does not stagnate.

The front inner fan 160f may form the flow of air such that air from the first end of the second channel is introduced into the first channel and such that air from the first channel is introduced into the second end of the second channel.

The front inner fan 160f may be provided between the second end of the second channel and the first channel. Particularly, the front inner fan 160f may be provided in the upper space B. That is, when the front heat exchanger 200f is provided at the one side of the housing 130, the front inner fan 160f may be provided at the other side of the housing 130, which is opposite the one side of the housing 130, at which the front heat exchanger 200f is provided.

In the case in which the front inner fan 160f is provided between the second end of the second channel and the first channel, the front inner fan 160f is located near the first channel, in which the largest amount of heat is generated, which is advantageous from the aspect of heat dissipation.

Since the thickness of the display device is not increased while an image output region is not hidden, the above position is appropriate.

From the aspect of heat, most of the heat in the front closed-loop air circulation system 1 is generated in the first channel, passes through the upper space B and the second channel, and moves to the third channel in the open-loop air circulation system 3 via the heat exchanger 200.

For heat dispersion, the left space C and the right space D in the second channel may have the same width. Generalizing the characteristics of the channel in the above embodiment, on the assumption that a single heat exchanger 200 is provided at a first side, which is one of the four sides of the display module 110 of the display device 100, a channel may be formed so as to extend from the heat exchanger 200, to extend through the first channel in the front space A of the display module 110, a second side opposite to the first side, and third and fourth sides adjacent to the first side, and to extend to the heat exchanger 200. The channel may be compositely defined by the display module 110, the housing 130, the front guide bracket 150f, and the diaphragm bracket 140.

Figure 6:
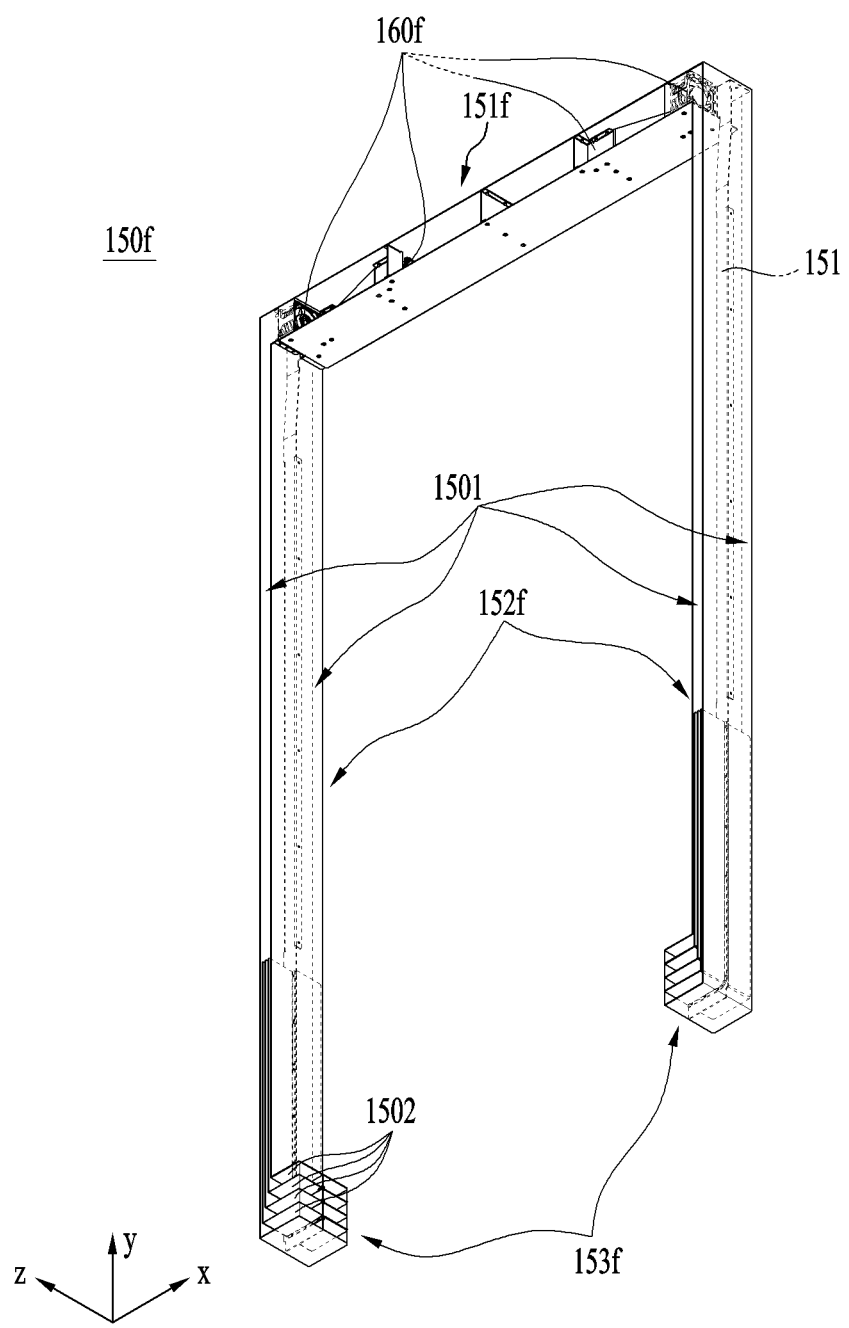
FIG. 6 is a front perspective view of a front guide bracket according to the present invention.

FIG. 6 is a front perspective view of the front guide bracket 150f according to the present invention.

The front guide bracket 150f may include an upper guide bracket 151f corresponding to the upper space B (see FIG. 5), a left and right guide bracket 152f corresponding to the left and right spaces C and D (see FIG. 5), and an outlet guide bracket 153f corresponding to a region that abuts on the front heat exchanger 200f. The upper guide bracket 151f, the left and right guide bracket 152f, and the outlet guide bracket 153f may be integrated, or may be separately provided and fastened or coupled to each other in order to constitute an assembly.

The front guide bracket 150f may define a plurality of channels 1501 through a partition bracket 151. Particularly in the case in which a plurality of front inner fans 160f is provided, the channels 1501 may be provided in a number corresponding to the number of front inner fans 160f. In this embodiment, the display device 100 is configured such that four front inner fans 160f are provided and four channels 1501 are provided so as to correspond to the four front inner fans 160f. In particular, each of the left space C (see FIG. 5) and the right space D (see FIG. 5) may be formed so as to have two channels 1501.

In the case in which the number of channels 1501 is set so as to correspond to the number of front inner fans 160f of the front closed-loop air circulation system 1 (see FIG. 2), the front inner fans 160f are provided in respective channels 1501, whereby it is possible to minimize the occurrence of turbulent flow.

Each channel 1501 may include a plurality of outlets 1502 so as to correspond to the number of inlets in the front heat exchanger 200f, whereby it is possible to minimize the occurrence of turbulent flow in the vicinity of the boundary therebetween. The outlets 1502 may be provided so as to correspond to the closed channel (see FIG. 3) in the front heat exchanger 200f such that air can be introduced from the second channel.

Figure 7:
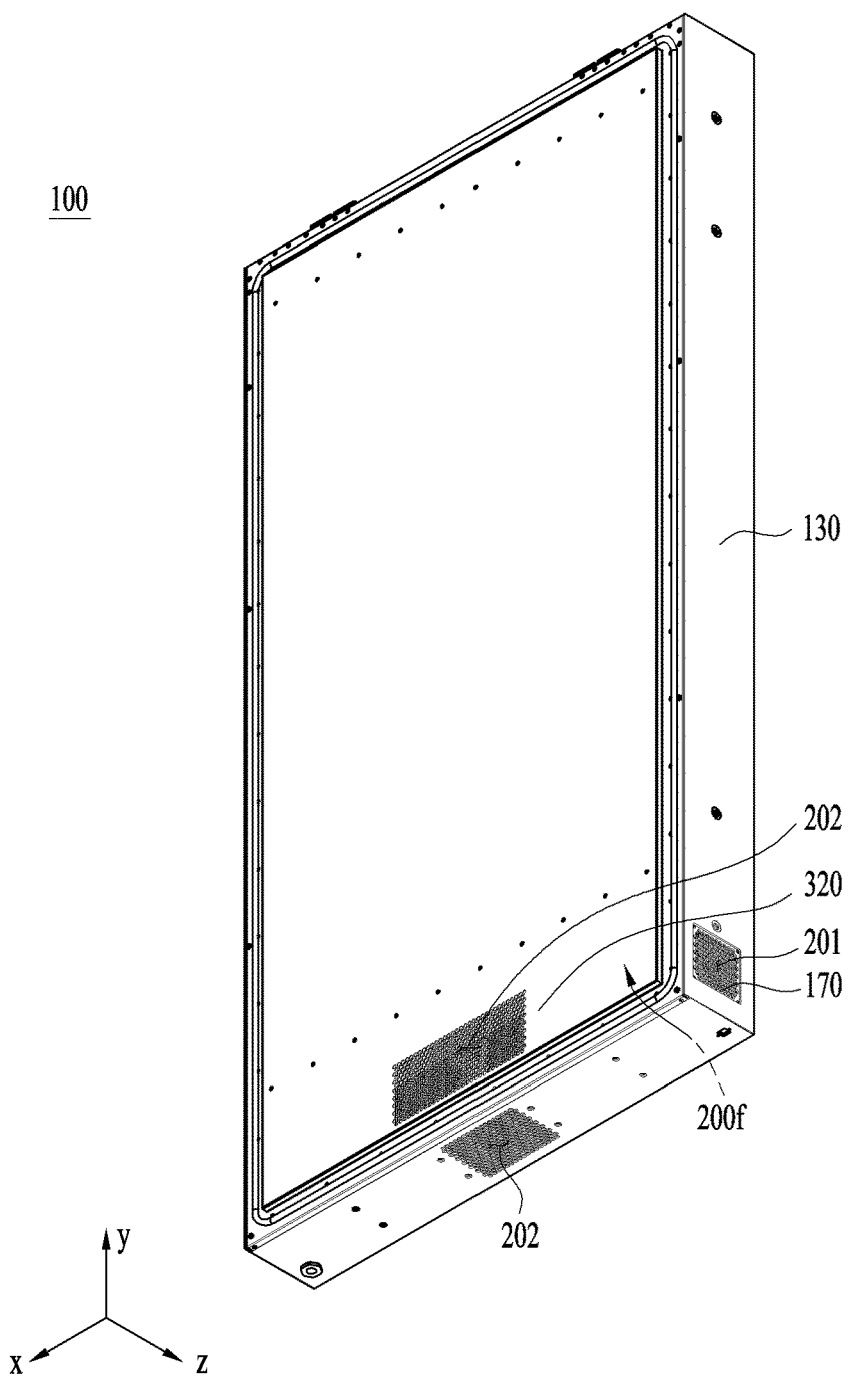
FIG. 7 is a rear perspective view of the display device according to the present invention.

FIG. 7 is a rear perspective view of the display device 100 according to the present invention. For the convenience of description, reference may also be made to FIGS. 3 to 5.

As previously described, heat from the closed channel in the front heat exchanger 200f is transferred to the third channel in the front heat exchanger.

One side of the third channel in the front heat exchanger 200f may be connected to an inlet port 201 in the rear closed-loop air circulation system 2, and the other side of the third channel in the front heat exchanger 200f may be connected to an output port 202 in the open-loop air circulation system 3.

The front heat exchanger 200f may be configured so as to be symmetrical with respect to the vertical center of the display device 100. For example, inlet ports 201 may be formed in left and right sides of the third channel in the heat exchanger 200, and an outlet port 202 may be located at the center of the display device 100 such that air introduced through the inlet ports 201 is mixed at the center of the display device 100 and the mixture is discharged through the outlet port 202. The reason for this is that the directions in which air flows in the closed channel of the heat exchanger 200 and the third channel are the same in at least a portion thereof such that heat from highest-temperature air in the closed channel is directly transferred to lowest-temperature air in the third channel.

Air from the first end of the second channel is introduced into the closed channel in the front heat exchanger 200f, is at the same time dispersed over the front region of the display module 110, and is introduced into the first channel. That is, air from the first end of the second channel does not flow to the center of the display device 100 along the closed channel in the front heat exchanger 200f before being introduced into the first channel, but the air is dispersed in the closed channel in the front heat exchanger 200f before being introduced into the first channel, whereby a bottleneck phenomenon does not occur during air circulation.

The outlet port 202 may be provided in the lower side or the rear of the display device 100 such that the flow rate of air is sufficient.

In addition, an outer fan 170 may be provided in the inlet port 201 in order to supply a sufficient amount of air into the open space 320 in the heat exchanger 200.

As previously described, the heat exchanger 200 may be a heat pipe type heat exchanger, a thermoelectric module type heat exchanger, a water-cooling type heat exchanger, or an LHP type heat exchanger. Depending on the type of the heat exchanger, heat from the closed channel may be directly transferred to the third channel or may be indirectly transferred to the third channel via a working fluid.

In the heat pipe type heat exchanger 200, heat is indirectly transferred via the working fluid. In an evaporation region, the working fluid receives heat from the closed space 310, moves to a condensation region due to the resultant pressure difference to transfer heat to the open space 320, and moves back to the evaporation region due to capillary force.

In the thermoelectric module type heat exchanger 200, electrons move between two metals having a potential difference therebetween when receiving energy, during which heat is transferred.

In the water-cooling type heat exchanger 200, a refrigerant is circulated by the pressure of a pump, whereby heat exchange is performed.

The LHP type heat exchanger 200 has a structure in which the refrigerant is evaporated by heat in the evaporation region, is liquefied as the result of heat exchange with the open space 320 in the condensation region, and moves back to the evaporation region, whereby the refrigerant is circulated.

Here, reference may be made again to FIGS. 2 and 4.

The rear closed-loop air circulation system 2 circulates air in the second closed space 312 in order to achieve heat dissipation. The rear closed-loop air circulation system 2 is provided so as to be partitioned from the front closed-loop air circulation system 1.

The front closed-loop air circulation system 1 and the rear closed-loop air circulation system 2 may be partitioned from each other by the display module 110, the diaphragm bracket 140, and the housing 130.

The driving unit 120 may be provided in the rear closed-loop air circulation system 2. The rear closed-loop air circulation system 2 mainly serves to discharge heat generated from the driving unit 120 to the outside.

The rear closed-loop air circulation system 2 may include a rear inner fan 160r for air circulation and a rear guide bracket 150r.

The rear guide bracket 150r is provided between the driving unit 120 and the rear surface 132 of the housing 130 to define a fourth channel, along which air from the second closed space 312 flows. The rear guide bracket 150r may have the shape of a plate that is parallel to the rear surface 132 of the housing 130.

The rear inner fan 160r forms the flow of air such that air can flow in the fourth channel. The rear inner fan 160r may be provided at one end of the rear guide bracket 150r to move air in a front region 3121 of the rear guide bracket 150r to a rear region 3122 of the rear guide bracket 150r. The air in the front region 3121 absorbs heat generated from the driving unit 120.

FIG. 4 shows the embodiment in which the rear inner fan 160r forms the flow of air downward from above. Alternatively, the rear inner fan 160r may form the flow of air upward from below.

The heat in the air that has moved to the rear region 3122 may be dissipated through the rear surface 132 of the housing 130. In the case in which heat dissipation is performed through the rear surface 132 of the housing 130 without a separate heat exchanger, the display device 100 is advantageous in terms of the weight and manufacturing cost thereof.

Alternatively, heat dissipation may be performed through heat exchange with a rear heat exchanger 200r.

The rear heat exchanger 200r may be provided at one side of the housing 130 to transfer heat from the rear closed-loop air circulation system 2 to the open-loop air circulation system 3. The fourth channel is connected to a closed channel in the rear heat exchanger 200r. The heat from the closed channel is discharged to a third channel in the rear heat exchanger 200r.

The rear heat exchanger 200r may be provided at the same side as the front heat exchanger 200f to share the third channel. In the case in which the front heat exchanger 200f and the rear heat exchanger 200r share the third channel and in which each of the heat exchangers is a heat pipe type heat exchanger, the front heat exchanger 200f may include a front heat pipe 203f (see FIG. 5), and the rear heat exchanger 200r may include a rear heat pipe 203r (see FIG. 5).

The front heat pipe 203f may extend through the closed channel in the front heat exchanger 200f and the third channel, and the rear heat pipe 203r may extend through the closed channel in the rear heat exchanger 200r and the third channel. That is, a portion of the front heat pipe 203f and a portion of the rear heat pipe 203r may be exposed to the open-loop air circulation system 3.

In consideration of space limitations or in order to reduce manufacturing costs, the front closed-loop air circulation system 1 and the rear closed-loop air circulation system 2 may exchange heat with each other through a single heat exchanger 200.

In this case, however, the first closed space 311 and the second closed space 312 may not be completely partitioned from each other by the closed channel in the heat exchanger 200.

Figure 8:
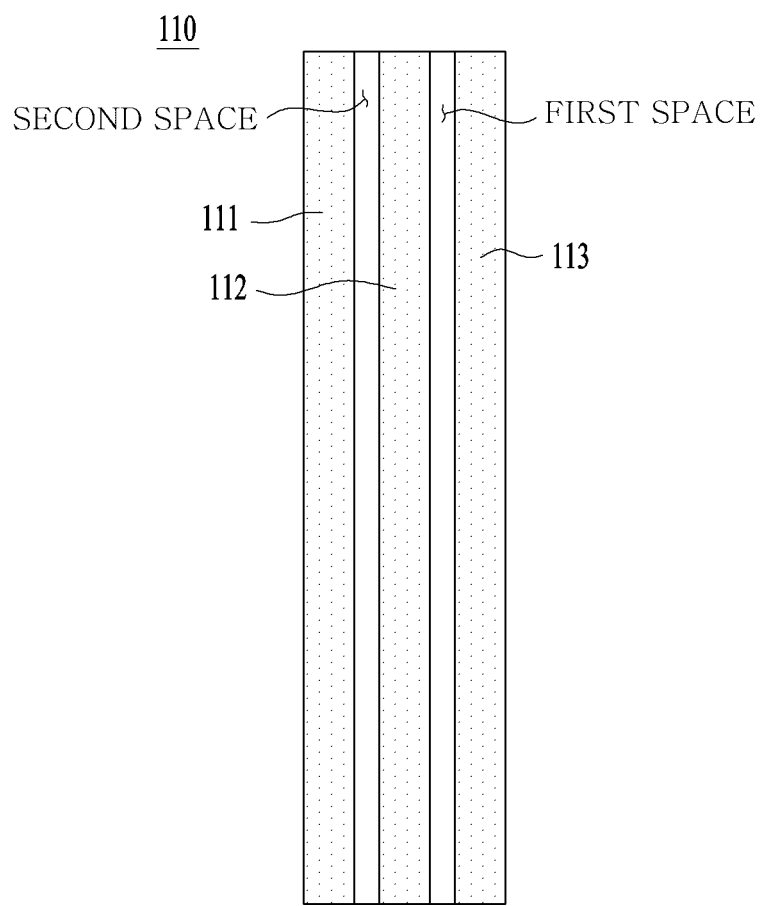
FIG. 8 is a sectional conceptual view of a display module.
Figure 9:
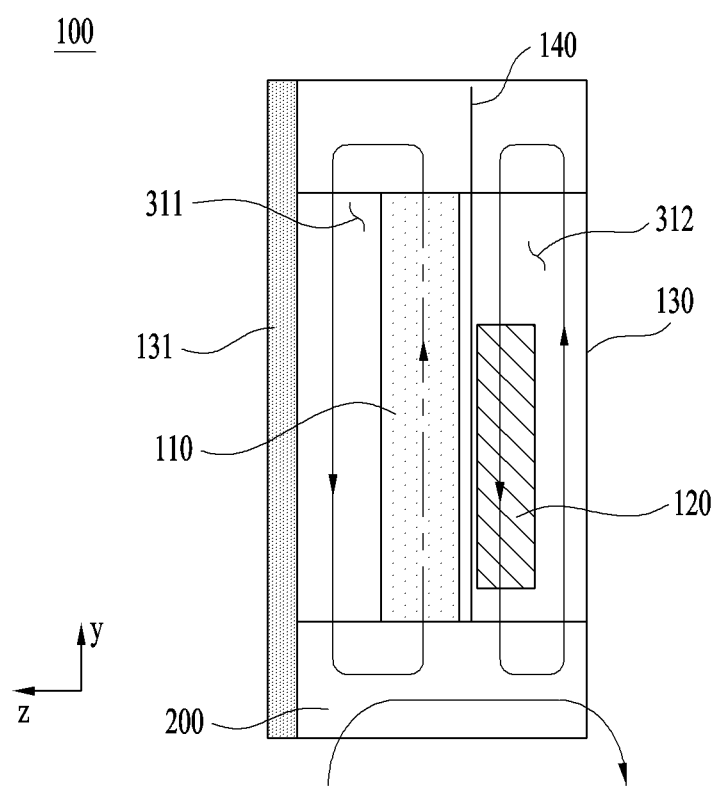
FIG. 9 is a side sectional conceptual view of another embodiment of the display device according to the present invention.
Figure 10:
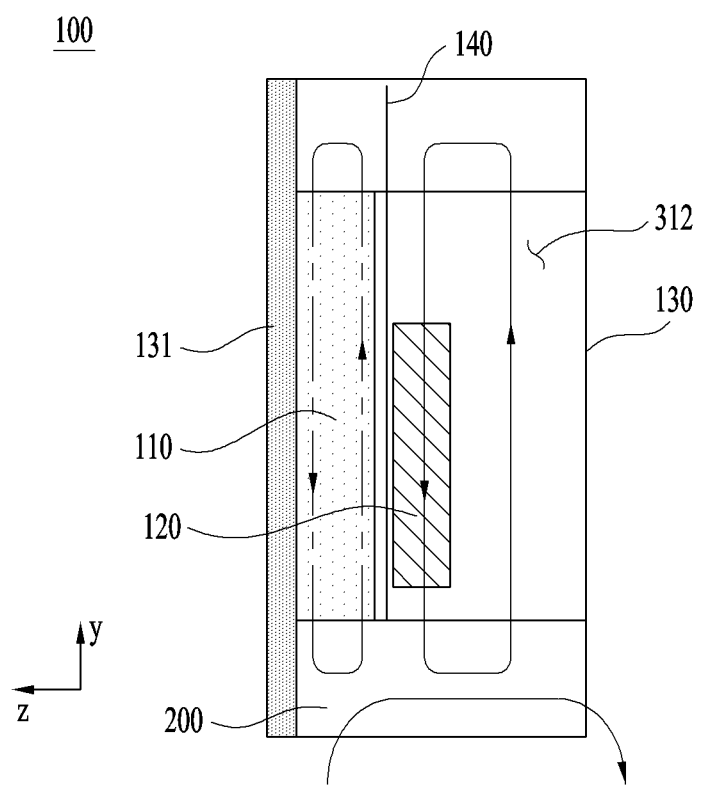
FIG. 10 is a side sectional conceptual view of another embodiment of the display device according to the present invention.

FIG. 8 is a sectional conceptual view of the display module 110, and FIGS. 9 and 10 are side sectional conceptual views of other embodiments of the display device 100 according to the present invention.

Except for the characteristics that will be described below, the characteristics of the previous embodiment will apply equally, unless incompatible therewith.

In these embodiments, air in the first closed space 311 is introduced into the display module 110 or air in the display module 110 is discharged into the first closed space 311, unlike the embodiment shown in FIGS. 1 to 7.

A large amount of heat is generated from between the internal components of the display module 110 as well as from the front of the display module 110. In particular, when the display module is an LCD type display module, a large amount of heat is generated from the backlight unit panel due to a light source thereof. Consequently, a structure for effectively performing heat dissipation is necessary. The following embodiments will be described on the assumption that the display device 100 includes an LCD type display module.

As shown in FIG. 8, the display module 110 may mainly include an LCD panel 111 for directly outputting an image through pixels, a backlight unit panel 113 for emitting light to the rear surface of the LCD panel 111, and a diffuser 112 provided between the LCD panel 111 and the backlight unit panel 113 for diffusing light emitted from the backlight unit panel 113 so as to be uniformly distributed over the LCD panel 111.

The space between the diffuser 112 and the backlight unit panel 113 is defined as a first space, and the space between the LCD panel 111 and the diffuser 112 is defined as a second space.

In order to effectively dissipate heat generated from the display module 110, a channel may be formed so as to extend through the first space or the second space. That is, a channel may extend from one side to the other side of the first space, or may extend from one side to the other side of the second space.

FIG. 9 shows an embodiment in which a channel is formed so as to extend once through the display module 110 in the first closed space 311, and FIG. 10 shows an embodiment in which a channel is formed so as to extend twice through the display module 110 in the first closed space 311.

In the embodiment of FIG. 9, air flows at the front of the display module 110, in the same manner as in the embodiment of FIGS. 1 to 7. Unlike the embodiment of FIGS. 1 to 7, however, air may reach the heat exchanger 200 through the display module 110, rather than moving along the side space of the display module 110.

In the case in which a channel is formed so as to extend through the display module 110, it is not necessary to form channels at the left and right sides of the display module, unlike the embodiment of FIGS. 1 to 7. Consequently, it is possible to minimize the size of the left and right bezel. In addition, heat is removed from a large area of the display module 110, whereby heat dissipation efficiency is improved.

In the embodiment of FIG. 10, the display module 110 is configured to abut on the front of the housing 130, i.e. the window 131. Unlike the previous two embodiments, the channel in the first closed space 311 may be formed so as to extend twice through the display module 110. In particular, the channel may extend once between the LCD panel 111 and the diffuser 112 and may extend once between the diffuser 112 and the backlight unit panel 113.

This embodiment has an advantage in that the window 131 and the display module 110 are not spaced apart from each other but heat is efficiently dissipated from the display module 110, whereby it is possible to minimize loss of visibility.

Figure 11:
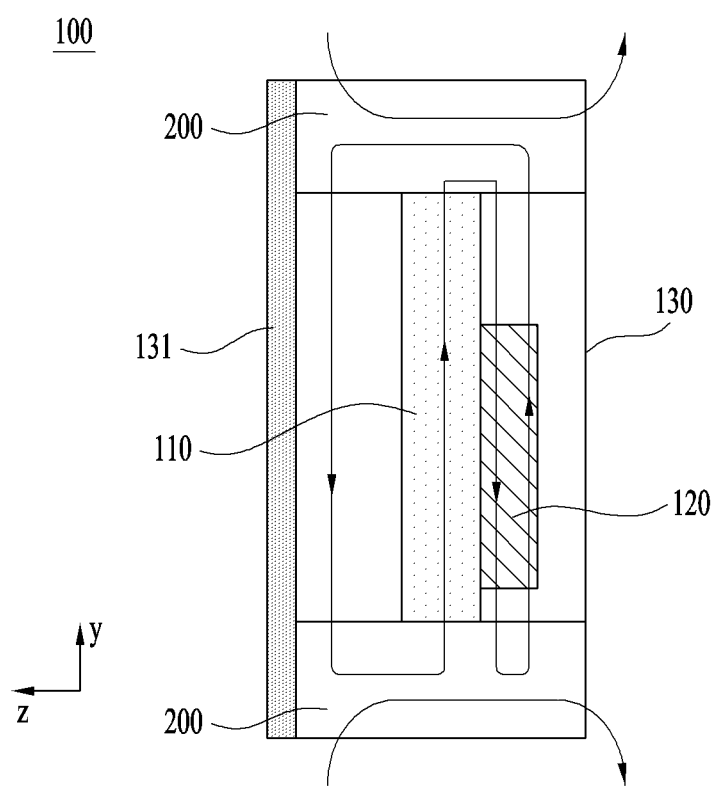
FIG. 11 is a side sectional conceptual view of another embodiment of the display device according to the present invention.
Figure 12:
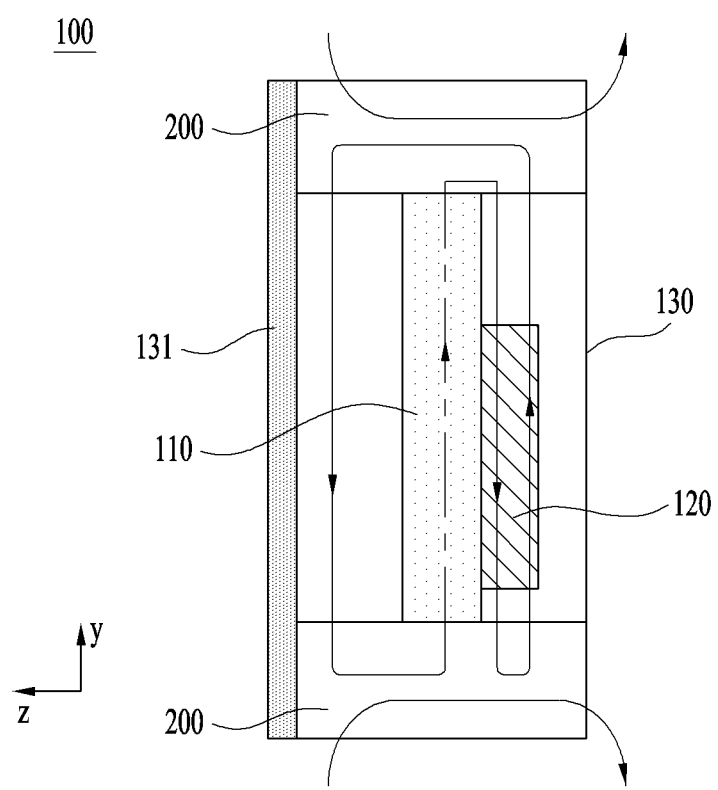
FIG. 12 is a side sectional conceptual view of another embodiment of the display device according to the present invention.
Figure 13:
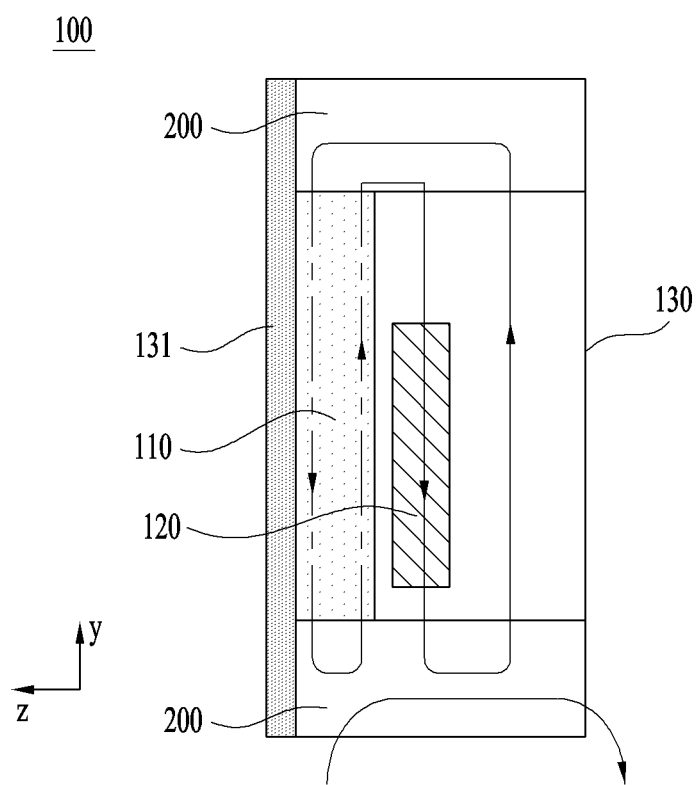
FIG. 13 is a side sectional conceptual view of a further embodiment of the display device according to the present invention.

FIGS. 11, 12, and 13 are side sectional conceptual views of other embodiments of the display device 100 according to the present invention. Except for the characteristics that will be described below, the characteristics of the previous embodiment will apply equally, unless incompatible therewith.

Unlike the previous embodiments, the display device 100 may be configured so as not to include the diaphragm bracket 140. In the case in which the diaphragm bracket 140 is not provided, the closed space 310 may be configured as a single space that exchanges heat with the heat exchanger 200. That is, the closed space 10 is not partitioned.

In the case in which the diaphragm bracket 140 is not provided, it is possible to reduce manufacturing costs for partitioning and sealing the first closed space 311 and the second closed space 312. In addition, it is possible to reduce the overall volume and weight of the display device 100 due to the omission of the diaphragm bracket 140.

In the case in which the diaphragm bracket 140 is not provided, however, the channel that extends to the heat exchanger 200 may be relatively long, compared to the amount of heat that is generated from the components of the display device, including the display module 110 and the driving unit 120. As a result, heat dissipation efficiency may be reduced. In order to solve this problem, a plurality of heat exchangers 200 may be provided.

The heat exchangers 200 may be provided at one side of the display device 100 and at the other side of the display device 100, which is opposite the one side of the display device. In the case in which the heat exchangers 200 are disposed at opposite sides of the display device so as to be spaced apart from each other, it is possible to simplify the structure of the channel while maximizing heat dissipation efficiency and to reduce an increase in the thickness of the display device 100.

As needed, however, a single heat exchanger 200 is provided at one side of the display device 100 in order to define a channel (not shown) in the display device 100. In this case, manufacturing costs are reduced, whereby the volume of the display device is minimized.

For example, as shown in FIG. 11, the channel may be configured to extend from the front of the display module 110, to extend through the heat exchanger 200 provided at one side of the display module 110, the side region of the display module 110, the heat exchanger 200 provided at the other side of the display module 110, the rear region of the display module 110, the heat exchanger 200 provided at one side of the display module 110, the rear region of the display module 110, and the heat exchanger 200 provided at the other side of the display module 110, and to extend to the front of the display module 110.

The embodiment of FIG. 12 has a structure similar to the structure of the embodiment of FIG. 11. However, the embodiment of FIG. 12 is characterized in that the channel extends once through the display module 110. That is, the channel may be configured to extend from the front of the display module 110, to extend through the heat exchanger 200 provided at one side of the display module 110, the inner region of the display module 110, the heat exchanger 200 provided at the other side of the display module 110, the rear region of the display module 110, the heat exchanger 200 provided at one side of the display module 110, the rear region of the display module 110, and the heat exchanger 200 provided at the other side of the display module 110, and to extend to the front of the display module 110.

The embodiment of FIG. 13 has a structure similar to the structure of the embodiment of FIG. 12. However, the embodiment of FIG. 13 is characterized in that the channel extends twice through the display module 110. In this structure, the channel extends through the display module 110, whereby heat dissipation efficiency is improved. In addition, the window 131 abuts on the display module 110, whereby visibility is improved. Furthermore, the diaphragm bracket is omitted, whereby the structure of the display device is simplified.

As is apparent from the above description, the display device according to the present invention has the following effects.

According to at least one of the embodiments of the present invention, it is possible to improve heat dissipation efficiency.

In addition, according to at least one of the embodiments of the present invention, it is possible to minimize the thickness of the display device.

In addition, according to at least one of the embodiments of the present invention, it is possible to reduce the manufacturing costs of the display device.

Those skilled in the art will appreciate that the present invention may be carried out in other specific ways than those set forth herein without departing from the spirit and essential characteristics of the present invention.

The above detailed description is not to be construed as limiting the present invention in any aspect, and is to be considered by way of example. The scope of the present invention should be determined by reasonable interpretation of the accompanying claims, and all equivalent modifications made without departing from the present invention should be understood to be included within the scope of the following claims.

What is claimed is:

1. A display device comprising:
   a housing;
   a display module mounted in the housing;
   a closed-loop air circulation system; and
   an open-loop air circulation system, wherein
   the closed-loop air circulation system comprises:
   a first channel defined between a front surface of the display module and a front surface of the housing so as to extend along the front surface of the display module; and
   a second channel defined between one side surface of the display module and one side surface of the housing that is opposite the one side surface of the display module so as to extend along the one side surface of the display module in a longitudinal direction thereof,
   the first channel being configured to receive air from a first end of the second channel and to discharge the air to a second end of the second channel, and wherein the open-loop air circulation system comprises:
   a third channel isolated from the first channel and the second channel;
   an inlet port for receiving air from an outside through the third channel; and
   an outlet port for discharging the air to the outside through the third channel.

2. The display device according to claim 1, wherein the housing comprises a window for covering at least a portion of the front surface of the display module, and the first channel is defined between the window and the front surface of the display module.

3. The display device according to claim 1, further comprising at least one fan provided at an upper part or a lower part of the display module such that the first channel receives air and discharges the received air to the second channel.

4. The display device according to claim 1, wherein the closed-loop air circulation system is a first closed-loop air circulation system, and wherein the display device further comprises a second closed-loop air circulation system provided at a rear of the first closed-loop air circulation system.

5. The display device according to claim 4, further comprising a diaphragm bracket for partitioning the first closed-loop air circulation system and the second closed-loop air circulation system from each other.

6. The display device according to claim 1, further comprising a heat exchanger for transferring heat from the closed-loop air circulation system to the open-loop air circulation system.

7. The display device according to claim 6, further comprising a front guide bracket for guiding air such that the air is introduced into the second channel from the first channel and such that the air from the second channel is introduced into the heat exchanger.

8. The display device according to claim 7, wherein the heat exchanger comprises an auxiliary guide bracket for guiding the air introduced from the second channel so as to discharge the same to the first channel.

9. The display device according to claim 6, wherein the heat exchanger is any one of a heat pipe type heat exchanger, a water-cooling type heat exchanger, a thermoelectric module type heat exchanger, and a loop heat pipe type heat exchanger.

10. The display device according to claim 1, wherein the closed-loop air circulation system is hermetically isolated from the open-loop air circulation system.

11. The display device according to claim 1, wherein the display module comprises a rear surface, which is opposite the front surface, an upper surface, a lower surface, which defines an inside of the upper surface, a first side surface, and a second side surface, which is opposite the first side surface, and wherein the second channel is provided at the first side surface and the second side surface of the display module so as to extend along the side surfaces of the display module.

* * * * *